(12) United States Patent
Theiler

(10) Patent No.: US 6,822,596 B2
(45) Date of Patent: Nov. 23, 2004

(54) ANALOG/DIGITAL CONVERTER THAT EMPLOYS PHASE COMPARISON

(75) Inventor: Helmut Theiler, Lieboch (AT)

(73) Assignee: Austriamicrosystem AG, Premstatten (AT)

( * ) Notice: Subject to any disclaimer, the term of this patent is extended or adjusted under 35 U.S.C. 154(b) by 0 days.

(21) Appl. No.: 10/287,919

(22) Filed: Nov. 5, 2002

(65) Prior Publication Data

US 2003/0085830 A1 May 8, 2003

(30) Foreign Application Priority Data

Nov. 5, 2001 (DE) .......................................... 101 54 249

(51) Int. Cl.[7] ................................................ H03M 1/12
(52) U.S. Cl. ........................ 341/155; 341/341; 341/111
(58) Field of Search ................................ 341/155, 111, 341/122, 123, 160

(56) References Cited

U.S. PATENT DOCUMENTS

| | | | | |
|---|---|---|---|---|
| 5,754,130 A | 5/1998 | Sakayori | ...................... | 341/111 |
| 6,049,297 A | * 4/2000 | Ducharme et al. | .......... | 341/111 |
| 6,232,908 B1 | * 5/2001 | Nakaigawa | .................. | 341/160 |
| 6,333,652 B1 | * 12/2001 | Iida et al. | .................... | 327/161 |
| 6,466,151 B2 | * 10/2002 | Nishii et al. | ................ | 341/155 |
| 6,573,851 B2 | * 6/2003 | Bult | ........................... | 341/155 |
| 6,677,879 B1 | * 1/2004 | Nix et al. | ................... | 341/161 |

OTHER PUBLICATIONS

Tietze, Schenk: Semiconductor Circuit Technology, 10th edition, pp. 774 to 777 (Translation Attached), 1995.

* cited by examiner

Primary Examiner—Peguy JeanPierre
(74) Attorney, Agent, or Firm—Fish & Richardson P.C.

(57) ABSTRACT

An analog/digital converter includes a first transfer circuit which receives an input voltage and outputs an output clock signal having a phase delay that is dependent on the input voltage, a second transfer circuit which receives a reference voltage and an input clock signal and outputs a reference clock signal having a phase delay that is dependent on the reference voltage, and a comparator which compares the output clock signal and the reference clock signal and outputs a digitally-coded output signal that is based on the result of the phase comparison of the output clock signal and the reference clock signal.

16 Claims, 5 Drawing Sheets

ANALOG/DIGITAL CONVERTER THAT EMPLOYS PHASE COMPARISON

CROSS-REFERENCE TO RELATED APPLICATION

This application claims priority to German Patent Application No. 101 54 249.6, filed on Nov. 5, 2001, the contents of which are hereby incorporated by reference into this application as if set forth herein in full.

TECHNICAL FIELD

This invention relates generally to analog/digital converters.

BACKGROUND

Analog/digital converters, also referred to as AD converters, or ADC, are used to convert an input voltage into a digitally-coded number proportional to the input voltage. The structure of the circuitry used in the AD conversion process depends on the conversion method/technique that is used. A distinction is drawn among conversion methods, namely the parallel method, the weighing method, and the counting method. The choice of the conversion method to be used depends, on the one hand, on the desired resolution and, on the other hand, on the desired converter frequency.

Integrated, rapid AD converters are normally operated using the parallel method. These so-called "flash converters" simultaneously compare an input analog voltage to a multitude of graduated reference voltages and determine the two reference voltages between which the input voltage lies. In this manner, a complete, digital number is obtained in a single operating step. A large number of comparators, which represent the speed-limiting element in such circuits, are provided to compare the input voltage with the graduated reference voltages. On the output end, the comparators are connected to a priority decoder, which converts the thermometer-like code of the comparator states into a binary coded number.

The principle of the parallel method of AD conversion described above is described, for example, in Tietze, Schenk: Semiconductor Circuit Technology, 10th edition, pages 774 to 777.

SUMMARY

One object of the present invention is to provide an analog/digital converter that is suitable for higher speed AD conversion.

According to the invention, this object is achieved with an analog/digital converter that includes an input for supplying an input voltage; an input for supplying a reference voltage; an input for supplying a clock signal; a first transfer circuit, which is connected to the input for supplying an input voltage and to the input for supplying a clock signal and provides, at its output, an input clock signal with a phase delay dependent on the input voltage; a second transfer circuit, which is connected to the input for supplying the reference voltage and to the input for supplying a clock signal and provides, at its output, a phase delay dependent on the reference voltage; and a comparator, which is connected to the first and second transfer circuit for transmitting input clock and reference clock signals and, dependent on a phase comparison of said signals, delivering a digital output signal.

The specified analog/digital converter is based on the principle of using at least one comparator to compare phase delays, which correspond to the input voltage to be converted or to the reference voltage(s), which may, if applicable, be graduated. In other words, according to this principle, a comparison is made of phase differences instead of voltage differences, with the phase differences being derived from voltage differences.

The assignment of input voltages to phase shifts, which, in the present invention, are phase shifts of a clock signal, is accomplished using the transfer circuits described above. The transfer circuits may be constructed as inverters that are operated unilaterally and in degenerative fashion by an additional component.

The comparator, which can advantageously be constructed using digital switching technology, switches to a logical state, depending on the difference between the phase delays of the input signal and the reference signal. According to the present invention, a phase difference may be defined as the difference between the phase delays of the input clock and reference clock signals, each with respect to the input-end clock signal.

As is commonly the case with AD converters that operate in accordance with the parallel method, the AD converter described above can be further developed into a multi-stage parallel converter or flash converter by adding additional converter stages. The combinatorial logic required to achieve this objective, which connects the outputs of the comparators to one another, may be designed to include the scanning-hold circuits, analogous to conventional parallel converters.

Thus, the AD converter described above does not operate, as has been customary until now, by comparing voltages or currents, but instead compares phase differences derived from these voltages or currents. This, in comparison to prior art AD converters, which operate in accordance with the parallel method, allows for a significant increase in speed and/or suitability for use with substantially higher frequencies.

According to a preferred embodiment of the present invention, the comparator features a means for storing of the output signal. The means for storing, in one embodiment, can be a clock-operated D-flip-flop.

According to another embodiment of the invention, the analog/digital converter may include several comparators, to the respective input ends of which are assigned a first and second transfer circuit. In addition, the AD converter may include a priority decoder, which connects the outputs of the comparators with one another and delivers a digitally-coded and therefore discrete-value signal, which is proportional to the input voltage. Furthermore, the AD converter may feature a reference voltage network, which supplies reference voltages graduated relative to one another to the second transfer circuit.

Analogous to conventional parallel converters, the reference voltage may be divided using, e.g., a resistor network, into equidistant partial voltages. Each of these partial voltages may be supplied to a respective comparator through a respective second transfer circuit. The input voltage itself may be supplied to each of the comparators through a respective first transfer circuit.

To achieve a high degree of circuit symmetry, the first and second transfer circuits can have an identical circuit structure. The electronic components used for the first and second transfer circuits may have a low pairing tolerance, i.e., a high degree of matching.

Also analogous to conventional parallel converters, the priority decoder analyzes the output signals of n (n≧1)

comparators, of which, for example, comparators 1 to i deliver a high level and comparators i+1 to n deliver a low level (or vice-versa), and convert this result, the so-called thermometer code, into a binary code.

According to another embodiment of the present invention, the comparator may be formed using a bistable trigger circuit. The comparator can, in an especially simple manner, be constructed as an RS-flip-flop, executed by countercoupling two logical NAND gates. According to another embodiment of the present invention, each of the transfer circuits comprises a control input, which is connected to the input for supplying a clock signal. The inverter can be operated as a so-called degraded inverter, in which the rising or falling clock edge of an input clock signal is phase-delayed dependent on an applied control signal, namely the input voltage or the reference voltage.

According to another embodiment of the present invention, each of the transfer circuits comprises a voltage-controlled component, which is connected to the inverter stage for adjustment of the phase delay and features a control input for supplying input or reference voltage. The voltage-controlled component can, for example, be formed as a voltage-controlled resistor or as a voltage-controlled current source, either of which is connected in series in the load current path of the inverter. Alternatively, a voltage-dependent capacity, for example, can be connected to the output of the inverter stages, with the control voltage, i.e., the input or reference voltage, being supplied to the open lead of the inverter stages.

According to another embodiment of the present invention, the first and second transfer circuits are further developed with a shared, for example, symmetrically formed input stage for supplying input or reference voltage, with, for example, the symmetrically or differentially formed input stage being connected to the respective inverter stages by way of current reflectors.

According to another embodiment, the invention is an analog/digital converter that includes a first transfer circuit which receives an input voltage and outputs an output clock signal having a phase delay that is dependent on the input voltage, a second transfer circuit which receives a reference voltage and an input clock signal and outputs a reference clock signal having a phase delay that is dependent on the reference voltage, and a comparator which compares the phase of the output clock signal and the reference clock signal and outputs a digitally-coded output signal that is based on the result of the comparison.

Additional details, advantageous embodiments and further developments of the invention are the subject matter of the dependent claims.

The invention will be explained in greater detail below on the basis of several exemplary embodiments.

DETAILED DESCRIPTION

Figure 1:
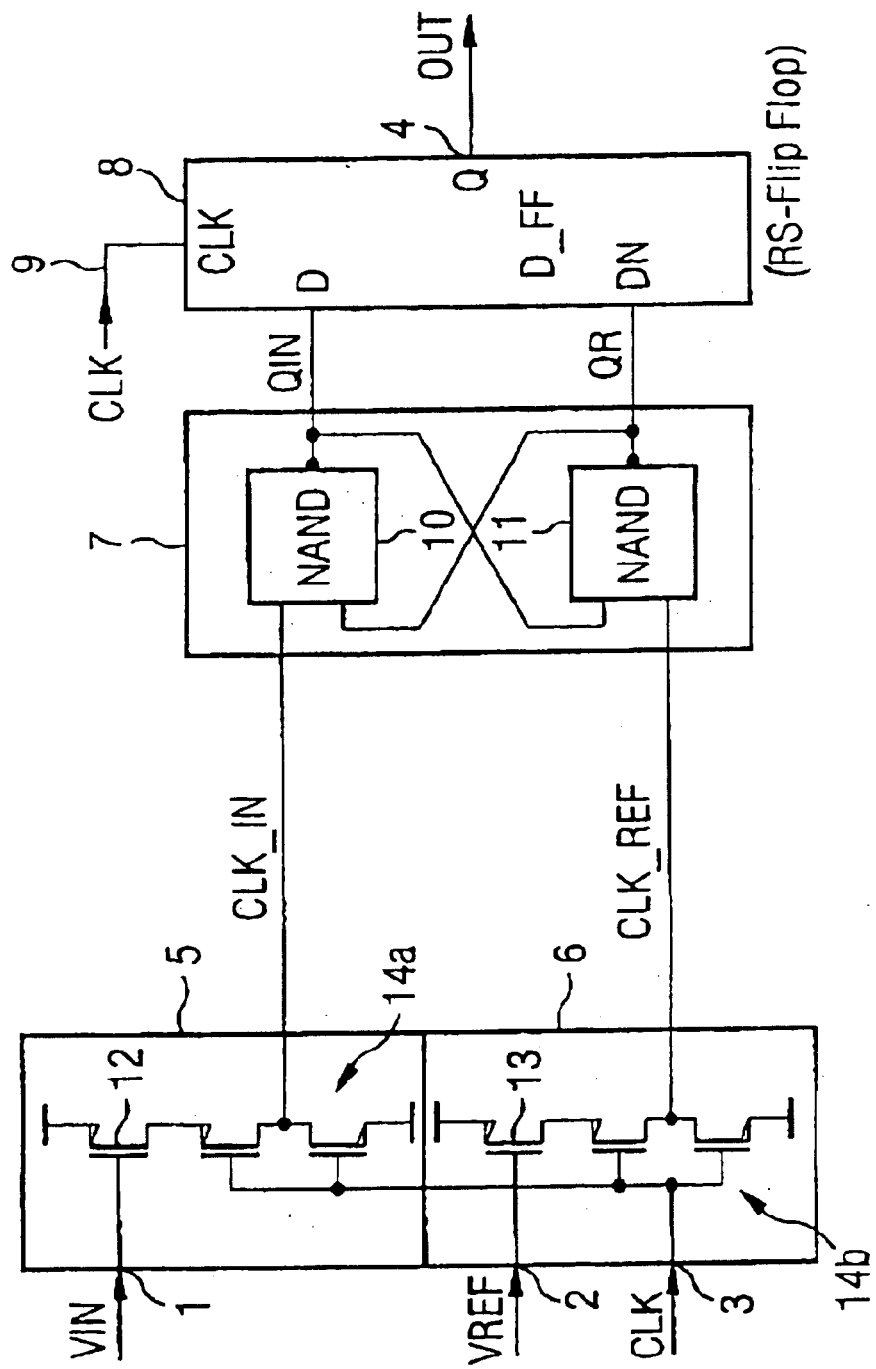
FIG. 1 depicts a simplified automated logic diagram of a first exemplary embodiment of one embodiment of the invention.

FIG. 1 depicts an analog/digital converter using a simplified automated logic diagram, with an input 1 for supplying an input voltage VIN, an input 2 for supplying a reference voltage VREF, an input 3 for supplying a clock signal CLK, and output 4, at which a digitally-coded output signal OUT is provided. A first transfer circuit 5 includes a CMOS inverter 14a with a connected input transistor 12. The first transfer circuit 5 is connected at its input end with the input for supplying an input voltage 1 and the input for supplying a clock signal 3, and provides an input clock signal CLK_IN at its output (i.e., CLK_IN is the output clock signal of first transfer circuit 5).

A second transfer circuit 6, which features the same circuit structure as the first transfer circuit 5, includes a CMOS inverter 14b with a connected input transistor 13. The second transfer circuit 6 is connected at its input end with an input for supplying the clock signal 3 and with the input for supplying a reference voltage 2. The second transfer circuit 6 provides a reference clock signal CLK_REF at its output.

Each of the above-described outputs of the first and second transfer circuits 5, 6 is connected to an input of a symmetrically constructed RS-flip-flop 7. A D-flip-flop 8 is connected downstream from, and to, this RS-flip-flop 7 to transfer output signals of the RS-flip-flop 7 to D-flip-flop 8. The D-flip-flop 8 also includes a clock input 9, to which the clock signal CLK can be applied.

The circuit shown in FIG. 1 converts, via transfer circuits 5, 6, the voltage difference between the inputs 1, 2, which results from the difference between the input voltage VIN and the reference voltage VREF, into a phase difference, which corresponds to this voltage difference. To this end, an input voltage-dependent phase delay of the shared clock signal CLK with respect to the rising signal edges is performed. Accordingly, the phase difference is present between the input clock signal CLK_IN and the reference signal CLK_REF at the output of the transfer circuits 5, 6. The comparison between these phase delays, in other words, the detection of which rising edge arrives first, is performed by the RS-flip-flop 7, to which the input clock signal CLK_IN or the reference clock signal CLK_REF is applied at the set or reset input. The symmetrically formed RS-flip-flop 7 switch flips into a logical state dependent on the phase difference. The storage or scanning and holding of this logical state is accomplished by the downstream D-flip-flop 8, which provides an output signal at its output 4.

Figure 2:
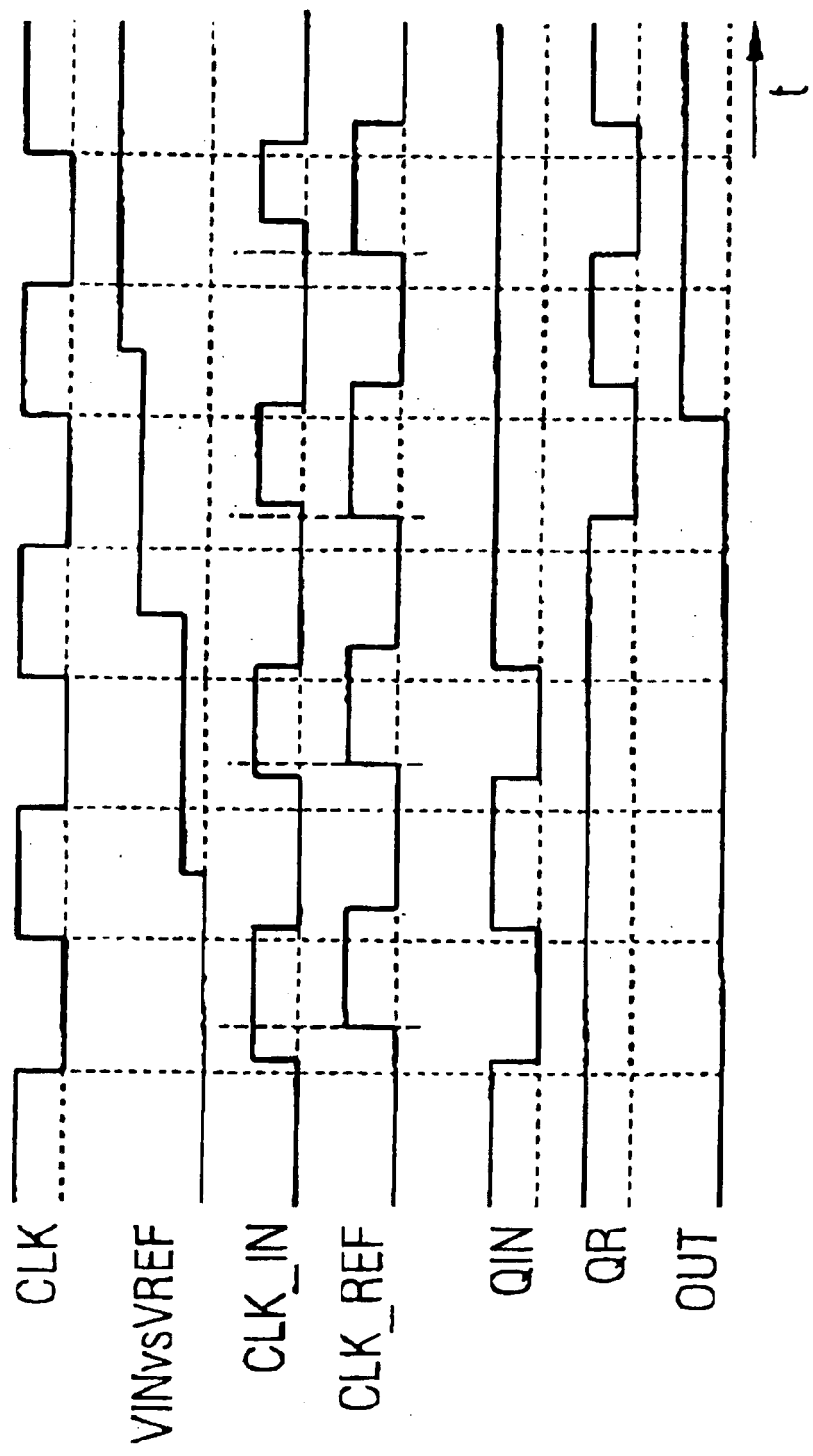
FIG. 2 depicts the time progressions of selected signals according to the automated logic diagram of FIG. 1.

To provide a better understanding of the circuit shown in FIG. 1, FIG. 2 depicts signal progressions of selected signals for a time t, namely those of the clock signal CLK, the difference between the input and reference voltages VIN, VREF, the input clock and reference clock signals CLK_IN, CLK_REF, the output signals of the RS-flip-flop QIN, QR, and the output signal OUT.

The rising clock edges of the input clock signal CLK_IN and the reference clock signal CLK_REF are delayed, depending on the input and reference voltage VIN, VREF. Together with the rising edges of these signals CLK_IN and CLK_REF, the RS-flip-flop 7 begins to flip into the logical low state. The NAND gate 10, 11 (of RS-flip-flop 7), at which the rising edges of the input clock or reference clock signals CLK_IN, CLK_REF respectively first arrive, acquires and, with a logical low at its output, blocks the respective other NAND gate 11, 10 from also going into the low state.

With this type of phase detection, it is may be important to secure highly symmetrical load conditions at all nodes of the circuit, particularly of the useful signal and the reference signal paths. The transfer circuits 5, 6 may be designed in such a way as to ensure that phase differences or phase delay differences in the range of 100 pSec correspond to the difference between the input and reference voltage VIN, VREF with respect to the Least Significant Bit, or LSB. In a highly symmetrical circuit layout, it is possible, according to the proposed principle, to detect phase delays in this range. Consequently, the circuit according to the present invention can attain converter rates in the range of at least 100 to 500 MHz, depending on the production process of the integrated circuit technology. In order to obtain, in the implementation depicted in FIG. 1, but further developed with multiple comparator stages, similar phase conditions for the comparator stages at both lower and higher reference voltage levels, the so-called degradation of the input transistors 12, 13 should be relatively substantial for higher reference voltage levels and relatively minor for lower reference voltage levels.

In addition to the possibility, as shown in FIG. 1, of being able to implement the described circuit with especially simple components, viewing FIGS. 1 and 2 in combination illustrates that very high converter rates can be achieved. Furthermore, the converter according to the present invention features especially low power consumption, as only relatively few circuit nodes must be charged. According to the present invention, no DC components, or direct current components, other than those needed to generate possibly graduated reference voltages are required.

As already explained, in order to guarantee the greatest possible precision of phase difference generation and phase difference detection, especially great importance is attached in the present principle to good matching of the transistors and also to the semiconductor production method used.

FIGS. 3a, 3b, 4a and 4b depict alternative embodiments for execution of the first and second transfer circuit 5, 6 for use in the AD converter circuit shown in FIG. 1.

Figure 3A:
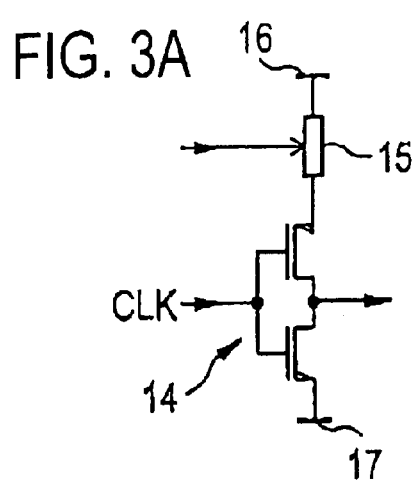
FIG. 3a depicts an exemplary embodiment of a transfer circuit for use in a circuit according to FIG. 1, comprising a voltage-controlled resistor for influencing the rising edge of the input clock signal.

FIG. 3a shows an exemplary embodiment of a transfer circuit with a CMOS inverter cell 14, as in FIG. 1. The circuit of FIG. 3a includes a PMOS and an NMOS transistor, and in which a voltage-controlled resistor 15 is connected in series in the load current path. At its load end, the voltage-controlled resistor 15 is connected with a supply voltage lead 16 and with the load path of the inverter 14, which in turn is connected to a reference voltage lead 17. Depending on whether the circuit shown in FIG. 3a is a first or second transfer cell 5, 6 type, either the input voltage or the reference voltage VIN, VREF can be supplied to the control input of the resistor 15. At the output end, at the inverter, the clock signal CLK, which is supplied at the input, can be acquired in a phase-delayed manner. The circuit shown in FIG. 3a allows for the voltage-controlled delay of the clock signal CLK with respect to the rising edge of the clock signal at the output. The voltage-controlled resistor 15 causes degeneration of the source lead of the P-channel or N-channel transistor of the inverter 14, depending on the structure of the circuit.

Figure 3B:
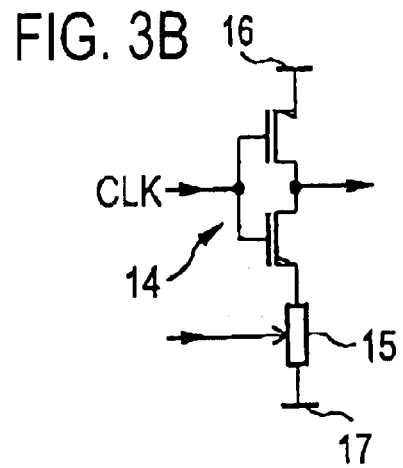
FIG. 3b depicts a circuit according to FIG. 3a, but for influencing the phase delay of the falling edge.

In terms of structure and mode of operation, FIG. 3b essentially corresponds to the circuit shown in FIG. 3a, differing from it only in that the arrangement of the inverter 14 and the voltage-controlled resistor 15 with respect to the supply voltage lead 16 and the reference voltage lead 17 is reversed. At the output, this results in a control voltage-dependent phase delay of the input clock signal CLK with respect to the falling instead of the rising clock edge.

Figure 4A:
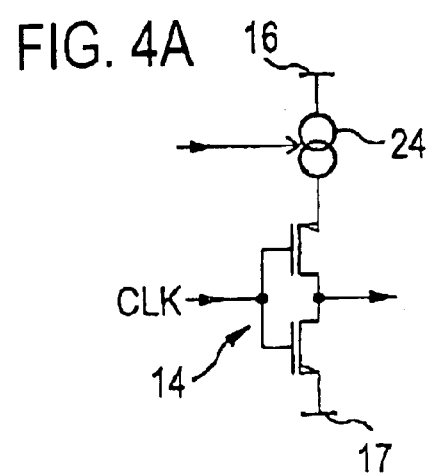
FIG. 4a depicts an alternative embodiment of the transfer circuit of FIG. 3a for influencing the rising clock edge, but by means of a voltage-controlled current source.

FIG. 4a depicts another, alternative embodiment of the transfer cells 5, 6. In terms of structure and mode of operation, it only differs from those shown in FIGS. 3a and 3b in that the voltage-controlled resistor 15 is replaced by a voltage-controlled current source 18.

Figure 4B:
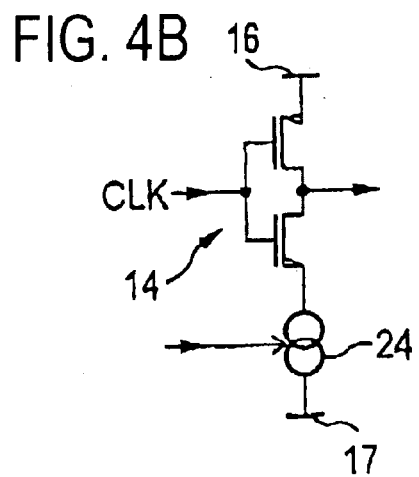
FIG. 4b depicts a circuit according to FIG. 4a, but for influencing the falling edge.

FIG. 4b, in turn, corresponds in terms of structure and mode of operation to the degenerated, voltage-controlled inverter stage shown in FIG. 4a, and only differs from it in that, analogous to the circuit of FIG. 3b, the voltage-controlled current source 18 and the CMOS inverter stage 14 are exchanged with respect to their supply voltage lead 16 and reference voltage lead 17. This results in a voltage-controlled phase delay of the falling clock edge at the output.

Figure 5:
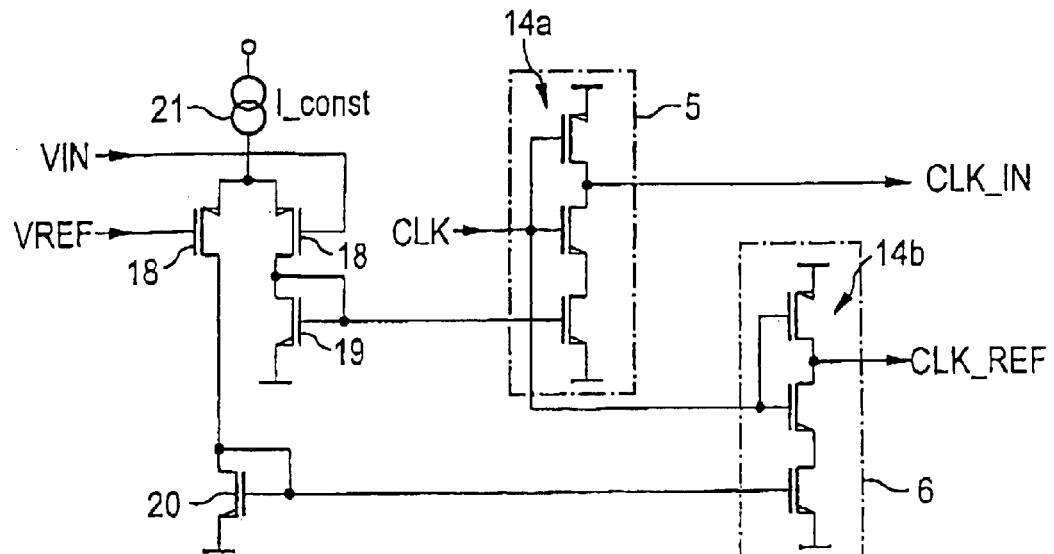
FIG. 5 depicts a further development of the transfer circuits according to FIG. 1, with a shared, symmetrical input stage.

FIG. 5 depicts a further development of the transfer circuits 5, 6, with a shared, symmetrical input stage 18, which is connected to the respective control inputs of the actual transfer stages 5, 6 through individual current reflector transistors 19, 20. In terms of structure and mode of operation, the transfer stages 5, 6 correspond to those described in accordance with FIG. 1. In the embodiment according to FIG. 5, however, the input transistors 12, 13 described there operate in conjunction with the current reflector transistors 19, 20, each acting as a current reflector. The input voltage VIN and the reference voltage VREF can be supplied to the symmetrical input stage 18, each at one of its respective inputs. At the load current end, the input stage transistors 18 are connected to a supply voltage lead through a constant current source 21.

The advantage of the additional, differentiated input stage 18, with its current reflector transistors 19, 20 for connection to the transfer circuits 5, 6, is that the conversion of the voltage level in phase delay is independent on, and constant across, the input voltage range of the variable input voltage VIN, which is to be made discrete.

Figure 6:
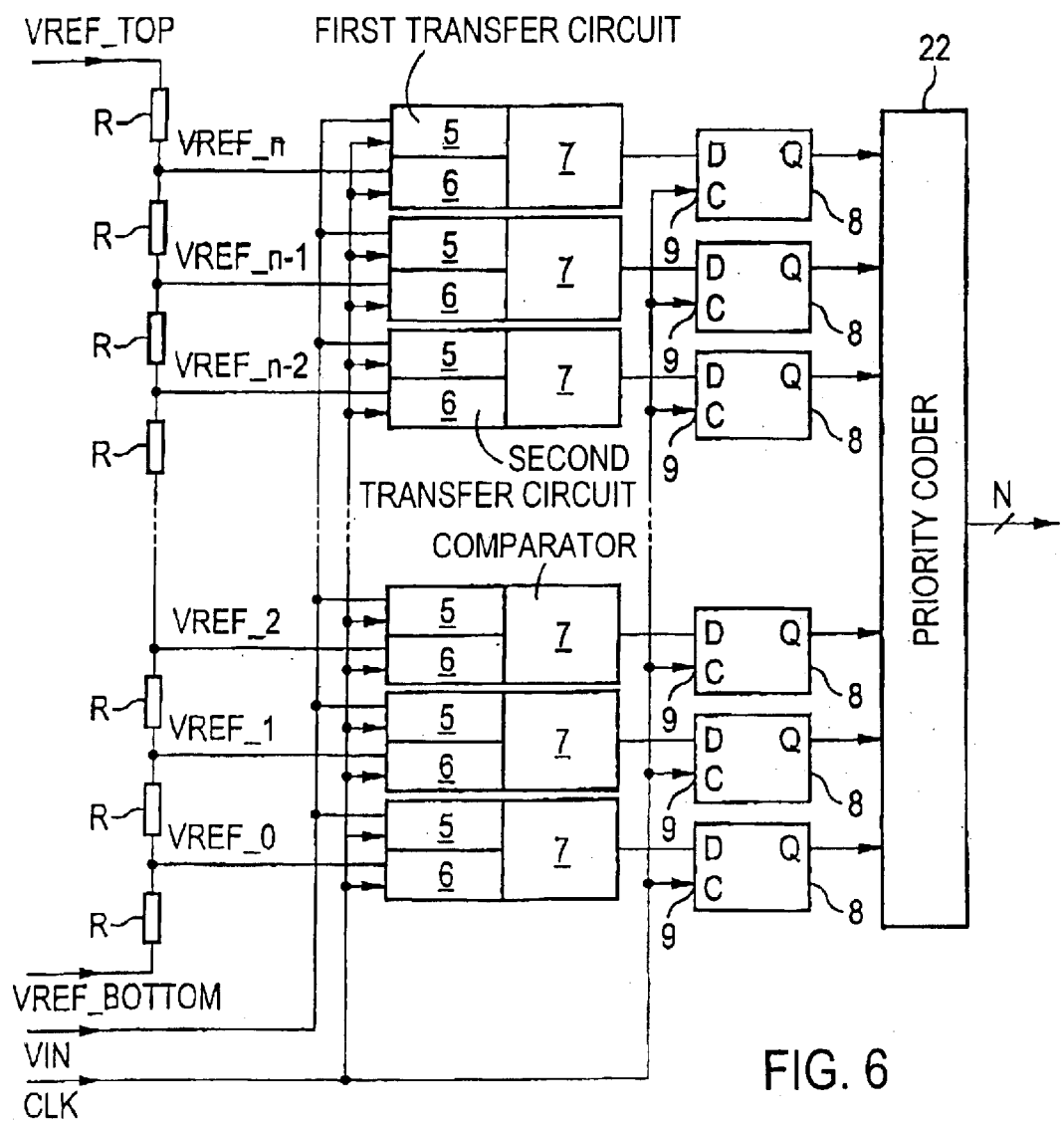
FIG. 6 depicts a further development of the AD converter circuit according to FIG. 1, with a multitude of parallel stages.

FIG. 6 depicts a simplified automated logic diagram of a multi-stage AD converter according to the present invention, which includes a multitude of converter circuits 5, 6, 7, 8 according to FIG. 1. The shared input voltage VIN and the shared clock signal CLK can be supplied to each of the first transfer circuits 5. N equidistantly graduated reference voltages VREF_0 to VREF_n, on the one hand, and the shared clock signal CLK, on the other, can be supplied to the second transfer circuits 6. The graduated reference voltages VREF_0 to VREF_n are generated through a resistor network operating as a voltage divider and comprising a large number of resistors R connected in series, which can be connected to a reference voltage generation circuit (not depicted) through a upper and a lower reference voltage VREF_TOP, VREF_BOTTOM. As already depicted and explained in the description of FIG. 1, a first and a second transfer circuit 5, 6 are connected to one another through a comparator circuit 7, with a D-flip-flop 8 being assigned and connected to the respective output ends of said transfer circuits. Each of the D-flip-flops 8 features a clock input 9, which is operated by the shared reference clock power supply and supplied with the clock signal CLK.

At the output end, the D-flip-flops 8 are connected to one another through a priority decoder 22, which delivers a binary coded output word that corresponds to the initially applied input voltage VIN. The flash AD converter according to FIG. 6, which operates in accordance with the principle of the invention, offers especially rapid AD conversion, a relatively simple structure, and especially lower current requirements.

Figure 7:
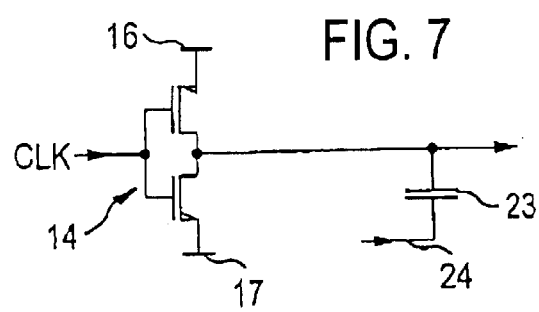
FIG. 7 depicts a further, alternative embodiment of a transfer cell with voltage-controlled capacity.

Finally, FIG. 7 depicts an embodiment of a transfer cell 5, 6, which includes a CMOS inverter cell 14, to the input end of which the clock signal CLK can be applied and the load end of which is connected to a reference and a supply voltage lead 17, 16. A controllable capacitor 23, with a control input 24 to which a control voltage VIN, VREF can be applied, is connected on the output end, at the CMOS inverter stage 14.

Other embodiments not specifically described herein are also within the scope of the following claims.

What is claimed is:

1. An analog/digital converter comprising:
   a first transfer circuit which receives an input voltage and outputs an output clock signal having a phase delay that is dependent on the input voltage;
   a second transfer circuit which receives a reference voltage and an input clock signal and outputs a reference clock signal having a phase delay that is dependent on the reference voltage; and
   a comparator which compares the output clock signal and the reference clock signal and outputs a digitally-coded output signal that is based on a comparison result of the output clock signal and the reference clock signal.

2. The analog/digital converter of claim 1, wherein the comparator includes circuitry to store the output signal.

3. The analog/digital converter of claim 1, wherein the comparator comprises a bistable trigger circuit.

4. The analog/digital converter of claim 1, wherein the comparator comprises an RS-flip-flop.

5. The analog/digital converter of claim 1, wherein each of the first transfer circuit and the second transfer circuit includes an inverter stage which receives the input clock signal.

6. The analog/digital converter of claim 5, wherein each of the first transfer circuit and the second transfer circuit includes a voltage-controlled component that is connected to an inverter stage for adjusting the phase delay.

7. The analog/digital converter of claim 1, wherein each of the first and second transfer circuits includes a shared input stage for supplying a differential voltage of the input voltage and the reference voltage, the shared input stage being connected to each of the first and second transfer circuits via a current reflector.

8. An analog/digital converter comprising:
   plural comparison circuits; and
   a priority decoder which receives outputs of each of the plural comparison circuits, the priority decoder generating a binary coded number that is based on the outputs of the plural comparison circuits;
   wherein each of the comparison circuits comprises:
      a first transfer circuit which receives an input voltage and outputs an output clock signal having a phase delay that is dependent on the input voltage;
      a second transfer circuit which receives a reference voltage and an input clock signal and outputs a reference clock signal having a phase delay that is dependent on the reference voltage; and
      a comparator which compares the output clock signal and the reference clock signal and outputs a digitally-coded output signal that is based on a comparison result of the output clock signal and the reference clock signal.

9. The analog/digital converter of claim 8, wherein the comparator includes circuitry to store the output signal.

10. The analog/digital converter of claim 8, wherein the comparator comprises a bistable trigger circuit.

11. The analog/digital converter of claim 8, wherein the comparator comprises an RS-flip-flop.

12. The analog/digital converter of claim 8, wherein each of the first transfer circuit and the second transfer circuit includes an inverter stage which receives the input clock signal.

13. The analog/digital converter of claim 12, wherein each of the first transfer circuit and the second transfer circuit includes a voltage-controlled component that is connected to an inverter stage for adjusting the phase delay.

14. The analog/digital converter of claim 8, wherein each of the first and second transfer circuits includes a shared input stage for supplying a differential voltage of the input voltage and the reference voltage, the shared input stage being connected to each of the first and second transfer circuits via a current reflector.

15. An analog-digital converter comprising:
   means for receiving an input voltage and for outputting an output clock signal having a phase delay that is dependent on the input voltage;
   means for receiving a reference voltage and an input clock signal and for outputting a reference clock signal having a phase delay that is dependent on the reference voltage; and
   means for comparing a phase of the output clock signal and the reference clock signal and for outputting a digitally-coded output signal that is based on a comparison result of the output clock signal and the reference clock signal.

16. An analog/digital converter conversion method, comprising:
   receiving an input voltage at a first circuit;
   generating an output clock signal at the first circuit, the output clock signal having a phase delay that is dependent on the input voltage;
   receiving a reference voltage and an input clock signal at a second circuit;
   generating a reference clock signal at the second circuit, the reference clock signal having a phase delay that is dependent on the reference voltage;
   comparing the output clock signal and the reference clock signal to output a digitally-coded output signal that is based on a phase comparison result of the output clock signal and the reference clock signal.

* * * * *